(12) United States Patent
Sharf et al.

(10) Patent No.: US 9,509,102 B2
(45) Date of Patent: *Nov. 29, 2016

(54) PLUGGABLE MODULE FOR A COMMUNICATION SYSTEM

(71) Applicant: Tyco Electronics Corporation, Berwyn, PA (US)

(72) Inventors: Alex Michael Sharf, Harrisburg, PA (US); Alan Weir Bucher, Manheim, PA (US); Nikhil Shankar, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/599,099

(22) Filed: Jan. 16, 2015

(65) Prior Publication Data

US 2016/0211623 A1   Jul. 21, 2016

(51) Int. Cl.
*H01R 13/00* (2006.01)
*H01R 13/66* (2006.01)
*H05K 7/20* (2006.01)

(52) U.S. Cl.
CPC ........ *H01R 13/665* (2013.01); *H05K 7/20436* (2013.01)

(58) Field of Classification Search
CPC .................. H01R 13/665; H05K 7/20436
USPC ............................ 439/485, 487, 540.1, 542, 439/607.21–607.56, 620.15, 439/620.21–620.23, 620.2
See application file for complete search history.

(56) References Cited

U.S. PATENT DOCUMENTS

| | | | | |
|---|---|---|---|---|
| 5,719,745 A * | 2/1998 | Agonafer | ............ | H01L 25/0657 174/16.3 |
| 5,719,754 A * | 2/1998 | Fraidlin | ............ | H02M 3/33569 363/17 |
| 6,201,699 B1 * | 3/2001 | Ayres | ............ | H01L 23/367 174/16.3 |
| 6,278,610 B1 * | 8/2001 | Yasufuku | ............ | H05K 7/1431 165/185 |
| 6,310,776 B1 * | 10/2001 | Byrne | ............ | H01L 23/367 174/16.3 |
| 6,602,091 B2 * | 8/2003 | Belady | ............ | H01R 13/533 361/704 |
| 6,793,517 B2 * | 9/2004 | Neer | ............ | H05K 5/0256 439/372 |
| 7,074,082 B2 | 7/2006 | Kerlin et al. | | |
| 7,142,428 B2 * | 11/2006 | Vackar | ............ | H01L 23/4093 257/E23.086 |
| 7,151,669 B2 * | 12/2006 | Liu | ............ | H01L 23/3675 165/185 |
| 7,625,223 B1 * | 12/2009 | Fogg | ............ | H05K 5/0247 361/715 |
| 8,089,767 B2 * | 1/2012 | Busch | ............ | H05K 7/20445 165/185 |
| 8,113,853 B2 * | 2/2012 | Coyle, Jr. | ............ | H02S 40/345 439/482 |
| 8,328,565 B2 | 12/2012 | Westman et al. | | |
| 8,570,744 B2 * | 10/2013 | Rau | ............ | G06F 1/20 361/679.52 |
| 8,767,403 B2 * | 7/2014 | Rau | ............ | G06F 1/20 361/721 |
| 8,817,469 B2 * | 8/2014 | Macall | ............ | G02B 6/4261 361/690 |

(Continued)

*Primary Examiner* — Amy Cohen Johnson
*Assistant Examiner* — Milagros Jeancharles

(57) ABSTRACT

A pluggable module includes a pluggable body extending between a mating end and a cable end. The pluggable body has a first end and an opposite second end with sides extending therebetween along a length of the pluggable body. The first end, second end and sides define a cavity. An internal circuit board is held in the cavity. The internal circuit board is provided at an end of a cable communicatively coupled to the internal circuit hoard. The pluggable body is configured to be plugged into a receptacle assembly such that the internal circuit board is communicatively coupled to a communication connector of the receptacle assembly. The pluggable body includes a plurality of fins extending outward from at least one of the first end, the second end and the sides. The fins are provided proximate to the cable end of the pluggable body.

19 Claims, 5 Drawing Sheets

(56) References Cited

U.S. PATENT DOCUMENTS

| | | | | |
|---|---|---|---|---|
| 8,894,438 B2* | 11/2014 | Schmitt | ............... | H01R 24/76 439/540.1 |
| 8,911,244 B2* | 12/2014 | Elison | ............... | H05K 7/20454 439/137 |
| 9,389,368 B1* | 7/2016 | Sharf | ............... | G02B 6/3814 |
| 9,391,407 B1* | 7/2016 | Bucher | ............... | H01R 13/6581 |
| 2006/0221573 A1* | 10/2006 | Li | ............... | G11C 5/143 361/704 |
| 2006/0250772 A1* | 11/2006 | Salmonson | ............... | G06F 1/20 361/698 |
| 2012/0052720 A1* | 3/2012 | David | ............... | H01R 13/6595 439/487 |
| 2012/0250735 A1 | 10/2012 | Tang et al. | | |

* cited by examiner

PLUGGABLE MODULE FOR A COMMUNICATION SYSTEM

BACKGROUND OF THE INVENTION

The subject matter described herein relates to a pluggable module for a communication system.

At least some known communication systems include receptacle assemblies, such as input/output (I/O) connector assemblies, that are configured to receive a pluggable module and establish a communicative connection between the pluggable module and an electrical connector of the receptacle assembly. As one example, a known receptacle assembly includes a receptacle housing that is mounted to a circuit board and configured to receive a small form-factor (SIP) pluggable transceiver. The receptacle assembly includes an elongated cavity that extends between an opening of the cavity and an electrical connector that is disposed within the cavity and mounted to the circuit board. The pluggable module is inserted through the opening and advanced toward the electrical connector in the cavity. The pluggable module and the electrical connector have respective electrical contacts that engage one another to establish a communicative connection.

One challenge often encountered in the design of the pluggable module and receptacle assembly is the heat generated during operation of the communication system, which negatively affects module/system reliability and electrical performance. Typically, heat is generated by components on the internal circuit board within the pluggable module and drawn away from the internal circuit board by the metal body of the pluggable module. In some cases, a heat sink that is held by the receptacle assembly housing in direct contact with the metal body of the pluggable module is used to transfer the heat from the pluggable module. Air flowing through and around the receptacle assembly transfers the heat that emanates from the pluggable module. As data throughput speeds of the pluggable modules increase, more heat is generated. Conventional designs are proving to be inadequate for the required heat transfer.

Accordingly, there is a need for a pluggable module for use in a communication system that allows significant heat transfer.

BRIEF DESCRIPTION OF THE INVENTION

In an embodiment, a pluggable module is provided including a pluggable body extending between a mating end and a cable end. The pluggable body has a first end and an opposite second end with sides extending therebetween along a length of the pluggable body. The first end, second end and sides define a cavity. An internal circuit board is held in the cavity. The internal circuit board is provided at an end of a cable communicatively coupled to the internal circuit board. The pluggable body is configured to be plugged into a receptacle assembly such that the internal circuit board is communicatively coupled to a communication connector of the receptacle assembly. The pluggable body includes a plurality of fins extending outward from at least one of the first end, the second end and the sides. The fins are provided proximate to the cable end of the pluggable body.

In another embodiment, a pluggable module is provided including a pluggable body extending between a mating end and a cable end. The pluggable body has a first end and an opposite second end with sides extending therebetween along a length of the pluggable body. The first end, second end and sides define a cavity. An internal circuit board is held in the cavity. The internal circuit board is provided at an end of a cable communicatively coupled to the internal circuit board. The pluggable body is configured to be plugged into a receptacle assembly such that the internal circuit board is communicatively coupled to a communication connector of the receptacle assembly. The pluggable body includes a plurality of first end fins extending outward from the first end and the pluggable body including a plurality of side fins extending outward from at least one of the sides.

In a further embodiment, a communication system is provided including a pluggable module having a pluggable body extending between a mating end and a cable end. The pluggable body has a first end and an opposite second end with sides extending therebetween along a length of the pluggable body. The first end, second end and sides define a cavity. The pluggable body has a plurality of fins extending outward from at least one of the first end, the second end and the sides. The pluggable module has an internal circuit board held in the cavity. The internal circuit board is provided at an end of a cable communicatively coupled to the internal circuit board. The communication system includes a receptacle assembly having a receptacle housing defining a module cavity with a port opening at a front end of the receptacle housing open to the module cavity. The front end of the receptacle housing is configured to be positioned within an opening of a faceplate. The module cavity receives the pluggable module through the port opening. The receptacle assembly has a communication connector within the receptacle housing at a rear end of the receptacle housing. The pluggable module is pluggably coupled to the communication connector such that the internal circuit board is communicatively coupled to the communication connector. The fins are positioned at the front end such that the fins allow airflow between the module cavity behind the faceplate and an exterior environment forward of the faceplate.

DETAILED DESCRIPTION OF THE INVENTION

Embodiments set forth herein include communication systems and pluggable modules of the same. The pluggable module provides significant thermal transfer for the components thereof. Various embodiments of the pluggable module include a pluggable body having a cost effective design. Various embodiments of the pluggable module include a pluggable body that facilitates heat transfer. Various embodiments of the communication system include thermal transport inserts that guide loading of the pluggable module into a corresponding receptacle assembly and that transfer heat away from the pluggable module body.

Unlike conventional pluggable modules that utilize riding heat sinks that are held by a receptacle assembly and that interface with a flat upper surface of the pluggable module, embodiments set forth herein have fins integral with the pluggable module body that transfer heat therefrom. The fins may have air channels therebetween that are open and allow air to flow along the fins to cool the pluggable modules. In various embodiments, the channels may receive rails of a thermal transport insert to allow direct thermal connection to the pluggable module to draw heat away from the pluggable module body to cool the pluggable module.

Figure 1:
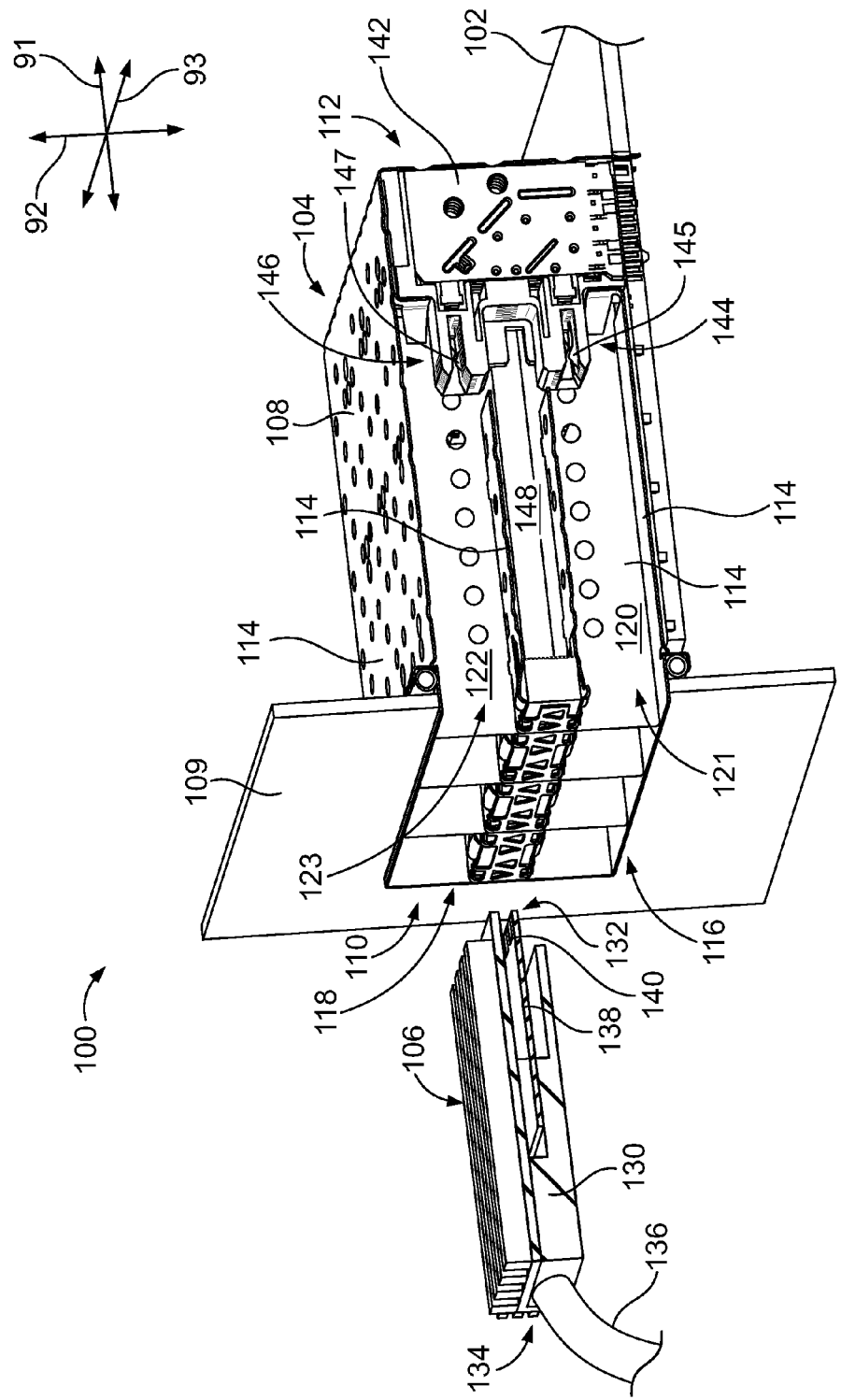
FIG. 1 is a perspective cross-sectional view of a communication system in accordance with an embodiment.

FIG. 1 is a perspective cross-sectional view of a communication system 100 in accordance with an embodiment. The communication system 100 may include a circuit board 102, a receptacle assembly 104 mounted to the circuit board 102, and one or more pluggable modules 106 that are configured to communicatively engage the receptacle assembly 104. The communication system 100 is oriented with respect to a mating or insertion axis 91, an elevation axis 92, and a lateral axis 93. The axes 91-93 are mutually perpendicular. Although the elevation axis 92 appears to extend in a vertical direction parallel to gravity in FIG. 1, it is understood that the axes 91-93 are not required to have any particular orientation with respect to gravity. Moreover, only one pluggable module 106 is shown in FIG. 1, but it is understood that multiple pluggable modules 106 may simultaneously engage the receptacle assembly 104.

The communication system 100 may be part of or used with telecommunication systems or devices. For example, the communication system 100 may be part of or include a switch, router, server, hub, network interface card, or storage system. In the illustrated embodiment, the pluggable module 106 is configured to transmit data signals in the form of electrical signals. In other embodiments, the pluggable module 106 may be configured to transmit data signals in the form of optical signals. The circuit board 102 may be a daughter card or a mother board and include conductive traces (not shown) extending therethrough.

The receptacle assembly 104 includes a receptacle housing 108 that is mounted to the circuit board 102. The receptacle housing 108 may also be referred to as a receptacle cage. The receptacle housing 108 may be arranged at a bezel or faceplate 109 of a chassis of the system or device, such as through an opening in the faceplate 109. As such, the receptacle housing 108 is interior of the device and corresponding faceplate 109 and the pluggable module(s) 106 is loaded into the receptacle housing 108 from outside or exterior of the device and corresponding faceplate 109.

The receptacle housing 108 includes a front end 110 and an opposite back end 112. The front end 110 may be provided at, and extend through an opening in, the faceplate 109. The mating axis 91 may extend between the front and back ends 110, 112. Relative or spatial terms such as "front," "back," "top," or "bottom" are only used to distinguish the referenced elements and do not necessarily require particular positions or orientations in the communication system 100 or in the surrounding environment of the communication system 100. For example, the front end 110 may be located in or facing a back portion of a larger telecommunication system. In many applications, the front end 110 is viewable to a user when the user is inserting the pluggable module 106 into the receptacle assembly 104.

The receptacle housing 108 is configured to contain or block electromagnetic interference (EMI) and guide the pluggable module(s) 106 during a mating operation. To this end, the receptacle housing 108 includes a plurality of housing walls 114 that are interconnected with one another to form the receptacle housing 108. The housing walls 114 may be formed from a conductive material, such as sheet metal and/or a polymer having conductive particles. In the illustrated embodiment, the housing walls 114 are stamped and formed from sheet metal. In some embodiments, the receptacle housing 108 is configured to facilitate airflow through the receptacle housing 108 to transfer heat (or thermal energy) away from the receptacle assembly 104 and pluggable module(s) 106. The air may flow from inside the receptacle housing 108 (for example, behind the faceplate 109) to the external environment (for example, forward of the faceplate 109) or from outside the receptacle housing 108 into the interior of the receptacle housing 108. Fans or other air moving devices may be used to increase airflow through the receptacle housing 108 and over the pluggable module(s) 106.

In the illustrated embodiment, the receptacle housing 108 includes a first (or bottom) row 116 of elongated module cavities 120 and a second (or top) row 118 of elongated module cavities 122. Each of the module cavities 120, 122 extends between the front and back ends 110, 112. The module cavities 120, 122 have respective port openings 121, 123 that are sized and shaped to receive a corresponding pluggable module 106. The module cavities 120, 122 may have the same or similar dimensions and extend lengthwise in a direction that is parallel to the mating axis 91. In the illustrated embodiment, each module cavity 122 is stacked over a corresponding module cavity 120 such that the module cavity 120 is positioned between the module cavity 122 and the circuit board 102. Any number of module cavities may be provided including a single module cavity.

In some embodiments, the pluggable module 106 is an input/output cable assembly having a pluggable body 130. The pluggable body 130 includes a mating end 132 and an opposite cable end 134. A cable 136 is coupled to the pluggable body 130 at the cable end 134. The pluggable body 130 also includes an internal circuit board 138 that is communicatively coupled to electrical wires or optical fibers (not shown) of the cable 136. The cable 136 may be communicatively coupled by directly terminating the wires to the internal circuit board 138, such as by soldering the wires to the internal circuit board. Alternatively, the cable 136 may be communicatively coupled by other processes, such as by using connectors at the end of the cable 136 and on the internal circuit board 138. The internal circuit board 138 is supported by the pluggable body 130. The circuit board 138 includes contact pads 140 at the mating end 132. In FIG. 1, the mating end 132 is configured to be inserted into the module cavity 122 of the receptacle housing 108 and advanced in a mating direction along the mating axis 91. In an exemplary embodiment, the pluggable body 130 provides heat transfer for the internal circuit board 138, such as for the electronic components on the internal circuit board 138. For example, the internal circuit board 138 is in thermal communication with the pluggable body 130 and the pluggable body 130 transfers heat from the internal circuit board 138. In an exemplary embodiment, the heat is transferred from at or near the mating end 132, such as where various electrical components are located on the internal circuit board 138, to the cable end 134. The heat is pulled out of the receptacle assembly 104 and mating end 132 and rejected to the external environment forward of the faceplate 109. In other embodiments, the heat may be drawn into other portions of the pluggable body 130 and/or the heat may be directed to other portions of the pluggable body 130, such as to the mating end 132 where the heat may be transferred to another heat sink or heat transferring component inside the chassis.

The receptacle assembly 104 includes a communication connector 142 having first and second mating interfaces 144, 146. The first mating interface 144 is disposed within the module cavity 120, and the second mating interface 146 is disposed within the module cavity 122. The first and second mating interfaces 144, 146 are aligned with the port openings 121, 123, respectively. Each of the first and second mating interfaces 144, 146 includes respective electrical contacts 145, 147 that are configured to directly engage the contact pads 140 of the pluggable module 106. Thus, a single communication connector 142 may mate with two pluggable modules 106.

In alternative embodiments, the receptacle assembly 104 does not include the stacked module cavities 120, 122 and, instead, includes only a single row of module cavities 120 or only a single module cavity 120. In such embodiments, the communication connector 142 may have a single row of mating interfaces or a single mating interface.

The pluggable module 106 is an input/output (I/O) module configured to be inserted into and removed from the receptacle assembly 104. In some embodiments, the pluggable module 106 is a small form-factor pluggable (SFP) transceiver or quad small form-factor pluggable (QSFP) transceiver. The pluggable module 106 may satisfy certain technical specifications for SFP or QSFP transceivers, such as Small-Form Factor (SFF)-8431. In some embodiments, the pluggable module 106 is configured to transmit data signals up to 2.5 gigabits per second (Gbps), up to 5.0 Gbps, up to 10.0 Gbps, or more. By way of example, the receptacle assembly 104 and the pluggable module 106 may be similar to the receptacle cages and transceivers, respectively, which are part of the SFP+ product family available from TE Connectivity.

Also shown in FIG. 1, the housing walls 114 of the receptacle housing 108 may optionally form a separator plate 148 between the module cavities 120, 122; however the separator plate 148 may not be included in various embodiments. The separator plate 148 extends generally parallel to the mating axis 91 between the front end 110 and the back end 112. More specifically, the module cavity 120, the separator plate 148, and the module cavity 122 are stacked along the elevation axis 92. Optionally, a light-indicator assembly (not shown), such as a light pipe may be provided in the separator cavity defined by the separator plate 148. The separator cavity may allow airflow between the module cavities 120, 122 to enhance heat transfer of the pluggable modules 106 located in the module cavities 120, 122.

Figure 2:
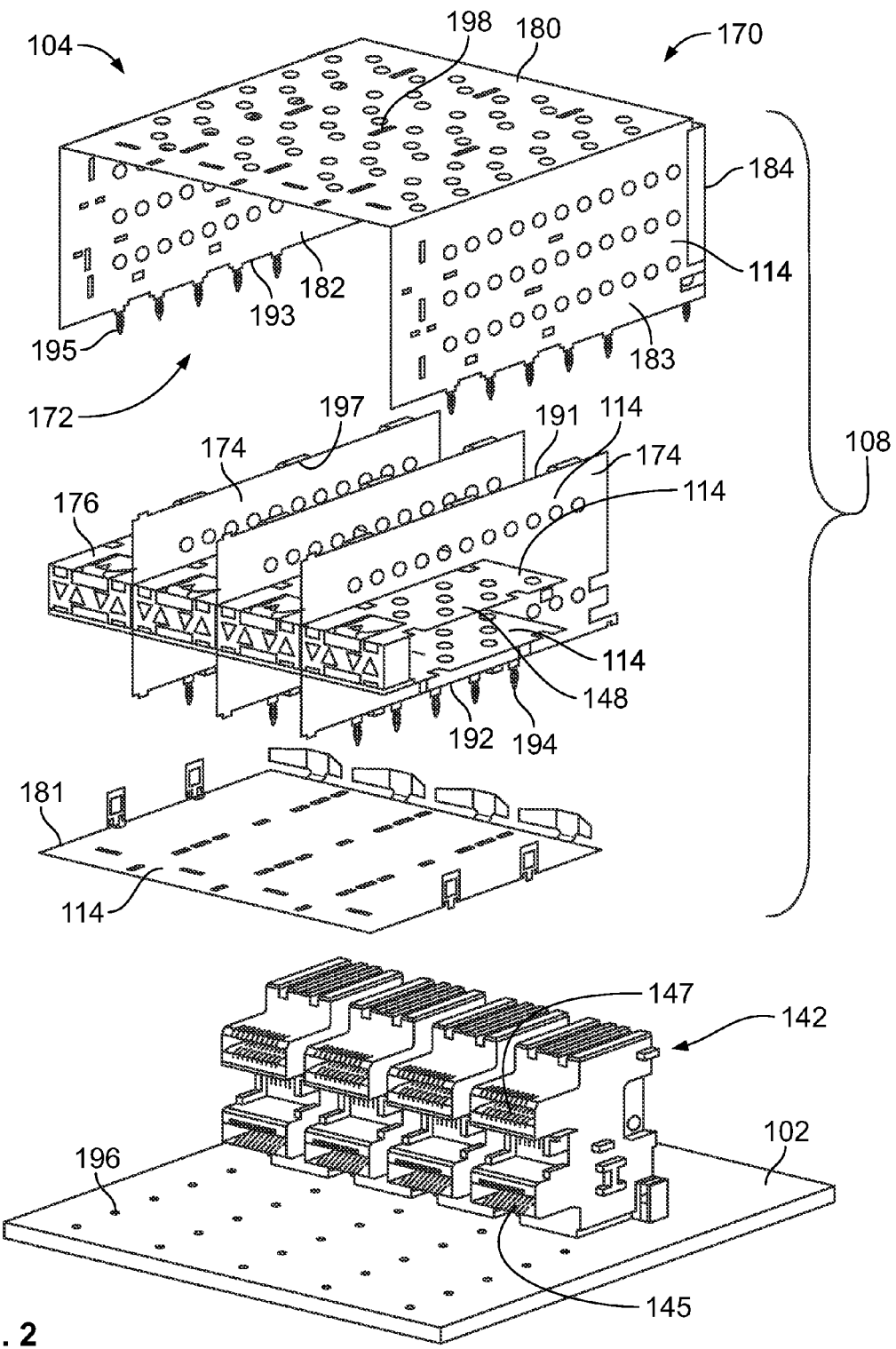
FIG. 2 is a partially exploded view of a receptacle assembly of the communication system shown in FIG. 1.

FIG. 2 is a partially exploded view of the receptacle assembly 104 and illustrates the receptacle housing 108 and a plurality of the communication connectors 142 mounted to the circuit board 102. In some embodiments, the receptacle housing 108 is formed from a plurality of interconnected panels or sheets. For example, the receptacle housing 108 includes a main panel or shell 170 that surrounds a housing cavity 172, a plurality of interior panels 174, a base panel 181, and separator panels 176 defining the separator plate 148. Each of the main panel 170, the interior panels 174, and the separator panels 176 may be stamped and formed from sheet metal. As described in greater detail below, each of the main panel 170, the interior panels 174, and the separator panels 176 may form one or more of the housing walls 114 that define the module cavity 120, the module cavity 122, and the separator plate 148 as shown in FIG. 1. As shown in FIG. 2, the main panel 170 includes an elevated wall 180, sidewalls 182, 183, and a back wall 184. The elevated wall 180 is located furthest from the circuit board 102 when the receptacle assembly 104 is constructed. The base panel 181 may rest on the circuit board 102. The sidewalls 182, 183 and the back wall 184 are configured to extend from the circuit board 102, when mounted thereto, to the elevated wall 180.

The interior panels 174 and the separator panels 176 are configured to be positioned within the housing cavity 172. Within the main panel 170, the interior panels 174 and the separator panels 176 apportion or divide the housing cavity 172 into the separate module cavities 120, 122 (FIG. 1) and the separator cavity of the separator plate 148 (FIG. 1).

In the illustrated embodiment, each of the interior panels 174 has a panel edge 191 that interfaces with the elevated wall 180 and a panel edge 192 that interfaces with the base panel 181 and/or the circuit board 102. The panel edge 192 may include mounting pins or tails 194 that are configured to mechanically engage and electrically couple to vias or thru-holes 196 of the circuit board 102. The panel edge 191 may include tabs or latches 197 that are configured to be inserted through slots 198 of the elevated wall 180 to couple to the elevated wall 180. Likewise, the sidewalls 182, 183 and the back wall 184 may have panel edges 193 that include mounting pins or tails 195 configured to mechanically engage and electrically couple to corresponding vias 196 of the circuit board 102.

The main panel 170, the base panel 181, the interior panels 174, and the separator panels 176 may comprise conductive material, such as metal or plastic. When the receptacle housing 108 is mounted to the circuit board 102, the receptacle housing 108 and the receptacle assembly 104 are electrically coupled to the circuit board 102 and, in particular, to ground planes (not shown) within the circuit board 102 to electrically ground the receptacle housing 108 and the receptacle assembly 104. As such, the receptacle assembly 104 may reduce EMI leakage that may negatively affect electrical performance of the communication system 100 (FIG. 1).

Figure 3:
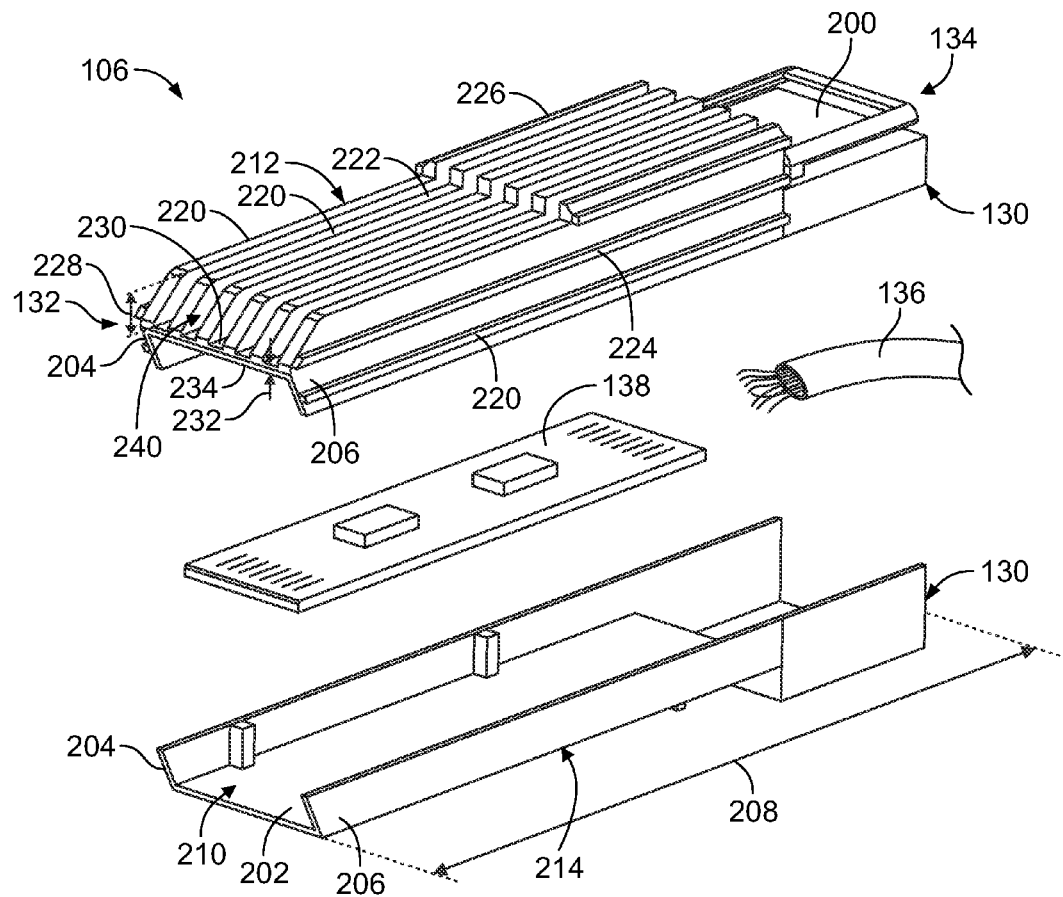
FIG. 3 is an exploded view of a pluggable module of the communication system formed in accordance with an exemplary embodiment.
Figure 4:
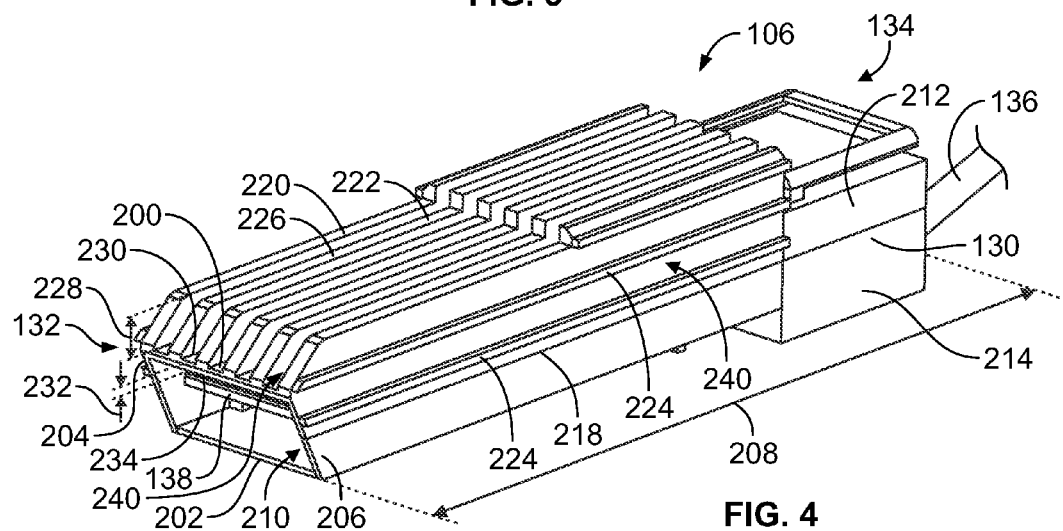
FIG. 4 is a front perspective view of the pluggable module shown in FIG. 3.

FIG. 3 is an exploded view of the pluggable module 106 in accordance with an exemplary embodiment. FIG. 4 is a front perspective view of the pluggable module 106 in accordance with an exemplary embodiment. The pluggable body 130 holds the internal circuit board 138. The pluggable body 130 has a first end 200 and an opposite second end 202 with sides 204, 206 extending between the first and second ends 200, 202. The first and second ends 200, 202 and the sides 204, 206 extend lengthwise along a length 208 of the pluggable body 130 between the mating end 132 and cable end 134. The first end 200, second end 202 and sides 204, 206 define a cavity 210 that holds the internal circuit board 138. Optionally, the internal circuit board 138 may be exposed at the mating end 132 for mating with the corresponding communication connector 142 (shown in FIG. 2).

In an exemplary embodiment, the pluggable body 130 includes a first shell 212 and a second shell 214. Optionally, the first shell 212 may define an upper shell and may be referred to hereinafter as upper shell 212. The second shell 214 may define a lower shell and be referred to hereinafter as lower shell 214. The upper shell 212 includes the first end 200, which defines an upper end or top of the pluggable body 130. The lower shell 214 includes the second end 202, which may define a lower end or bottom of the pluggable body 130. In an exemplary embodiment, the sides 204, 206 are defined by both the upper shell 212 and the lower shell 214. However, in alternative embodiments, the upper shell 212 may define the sides 204, 206, or alternatively, the lower shell 214 may define the sides 204, 206. Optionally, the upper and lower shells 212, 214 may define approximately equal portions of the sides 204, 206. Alternatively, either the upper shell 212 or the lower shell 214 may define a significant majority of the sides 204, 206.

The internal circuit board 138 is arranged at or near a center plane of the pluggable module 106, which may be centered between the first and second ends 200, 202. Optionally, the upper and lower shells 212, 214 may meet at or near the center plane. A seam 218 may be defined at the interface between the upper and lower shells 212, 214.

In an exemplary embodiment, the upper shell 212 is used for heat transfer from the internal circuit board 138. The upper shell 212 is placed in thermal communication with the internal circuit board 138. Heat generated by the internal circuit board 138 is drawn into the upper shell 212 and transferred therefrom. In an exemplary embodiment, the upper shell 212 includes a plurality of fins 220 extending therefrom. The fins 220 increase the surface area of the upper shell 212 and allow greater heat transfer from the upper shell 212. The fins 220 may extend from any portion of the upper shell 212. In various embodiments, the fins 220 extend from the top or first end 200 and are generally identified as end fins 222. In various embodiments, the fins 220 extend from the sides 204, 206 and are generally identified as side fins 224. Optionally, at least some side fins 224 may extend outward from end fins 222.

The fins 220 run lengthwise between the cable end 134 and the mating end 132. Optionally, the fins 220 may run substantially the entire length from the cable end 134 to the mating end 132. Optionally, the fins 220 may be recessed inward from the cable end 134 and/or the mating end 132. In the illustrated embodiment, the fins 220 are parallel plates. The plates may extend continuously between opposite ends of the fins 220. In alternative embodiments, other types of fins 220 may be used, such as fins 220 in the form of pins or posts extending from the pluggable body 130. The pins may be arranged in rows and columns and may be separated from each other to allow air flow around the pins and between the various pins.

The fins 220 extend to distal edges 226 that are elevated distances 228 from an exterior surface 230 of the pluggable body 130. For example, the pluggable body 130 includes a thickness 232 defined between an interior surface 234 defining the cavity 210 and the exterior surface 230 opposite the interior surface 234. The fins 220 extend outward from the exterior surface 230 such that distal edges 226 of the fins 220 are spaced outward from the exterior surface 230. The fins 220 are not recessed into the thickness 232, but rather are elevated outward of the exterior surface 230. The fins 220 greatly increase the surface area of the pluggable body 130 to encourage heat transfer.

The fins 220 are separated by channels 240. Optionally, the channels 240 may have a uniform spacing between the fins 220. For example, sides of the fins 220 may be planar and parallel. The fins 220 and channels 240 may extend along the length of the pluggable body 130 such that the channels 240 are open at the cable end 134 and/or the mating end 132 to allow air to flow along the fins 220, such as from the cable end 134 toward the mating end 132 or from the mating end 132 toward the cable end 134. In various embodiments, the channels 240 may be shaped or contoured, such as to encourage airflow therethrough. For example, the fins 220 may be shaped like an airfoil to control airflow through the channels 240. In an exemplary embodiment, the channels 240 may receive portions of a thermal transport insert to encourage heat transfer from the pluggable body 130.

Having the upper shell 212 comprise a plurality of the fins 220 allows more heat to be transferred by the upper shell 212 than with conventional pluggable body shells, which typically include a flat upper surface. For example, conventional pluggable body shells typically mate with a riding heat sink that is held by the receptacle assembly and rests on the upper surface to transfer heat from the pluggable body. Heat transfer across the interface between the pluggable body and the riding heat sink is reduced by the thermal resistance at the interface, which reduces the effectiveness of the designs of such conventional systems. Additionally, for stacked systems, typically only the pluggable bodies in the upper module cavities interface with the heat sink, and the pluggable bodies in the lower module cavities do not have the benefit of transferring heat into a heat sink. However, the finned upper shells 212 of the pluggable bodies 130 received in either module cavity 120, 122 will provide improved heat transfer, as compared to conventional pluggable modules. More efficient heat transfer is achieved using the upper shell 212 with the fins 220 as compared to conventional shells of conventional pluggable bodies.

In an exemplary embodiment, the upper shell 212 is fabricated from a material having a high thermal conductivity. For example, the upper shell 212 may be manufactured from copper or aluminum. Using a material having a high thermal conductivity allows more efficient heat transfer from the internal circuit board 138. In an exemplary embodiment, the upper shell 212 may be manufactured by an extrusion process such that the upper shell 212 includes an extruded body; however the upper shell may be manufactured by other processes in alternative embodiments, such as a die casting process, a machining process, a stamp and forming process of a sheet metal body, a layering build-up process, such as 3D printing, or another process. Extruding the upper shell 212 is a less expensive manufacturing process than some other processes, such as machining. Additionally, extrusion is a process that may be used on materials having high thermal conductivity. For example, some other processes, such as die casting, require additives or impurities in some materials, such as aluminum, which lowers the thermal conductivity of such material. Additionally, the porosity of the material from die casting may be higher, leading to a lower thermal conductivity of the material. As such, shells made by such die casting may be less effective at heat transfer than shells made from extrusion. The extrusion process creates a simple structure having generally flat walls or surfaces. The fins 220 may be easily extruded with the other portions of the upper shell 212. The upper shell 212 has a generally uniform cross-section along the length 208, even including the fins 220.

The lower shell 214 may be manufactured in a similar manner as the upper shell 212. The lower shell 214 may include fins (not shown). In contrast, in various embodiments, the lower shell 214 may be manufactured differently than the upper shell 212. For example, substantially all of the heat from the internal circuit board 138 may be drawn into the upper shell 212 as opposed to the lower shell 214. The upper shell 212 may thus be designed to achieve significant heat transfer. The lower shell 214, in contrast, may be designed to achieve other advantages. For example, in various embodiments, because the upper shell 212 is extruded, such as to reduce cost of manufacturing the upper shell 212 and/or to provide a material having better heat dissipation, the upper shell 212 may have a simple design, such as a substantially uniform cross-section. Because the upper shell 212 does not include robust assembly features, the lower shell 214 may have a more complex design as compared to the upper shell 212. The complex design may require die casting or machining to form the various features needed. For example, the body of the lower shell 214 may have supporting features, alignment features, guide features and/or connection features for the internal circuit board 138 and/or for coupling the upper shell 212 to the lower shell 214. For example, the body may include one or more pockets that receive various electrical components of the internal circuit board 138. The body may include supporting elements for supporting the internal circuit board 138. The body may include alignment elements for aligning the internal circuit board 138 within the cavity 210 and/or for aligning the upper shell 212 with the lower shell 214 for connection thereto. The body may include securing features used for securing the upper shell 212 to the lower shell 214. For example, the securing features may include threaded bores that receive threaded fasteners to secure the upper shell 212 to the lower shell 214. Other types of securing features may be provided in alternative embodiments, such as latches, clips, and the like for securing the upper shell 212 to the lower shell 214. The body may include a cable support for supporting and/or aligning the cable 136 with the body.

The lower shell 214 may be manufactured from any type of material, such as a material that may be readily die cast. For example, the lower shell 214 may be manufactured from zinc, which is an easy metal to cast as zinc has high ductility, high impact strength and lower costs than other metals.

Figure 5:
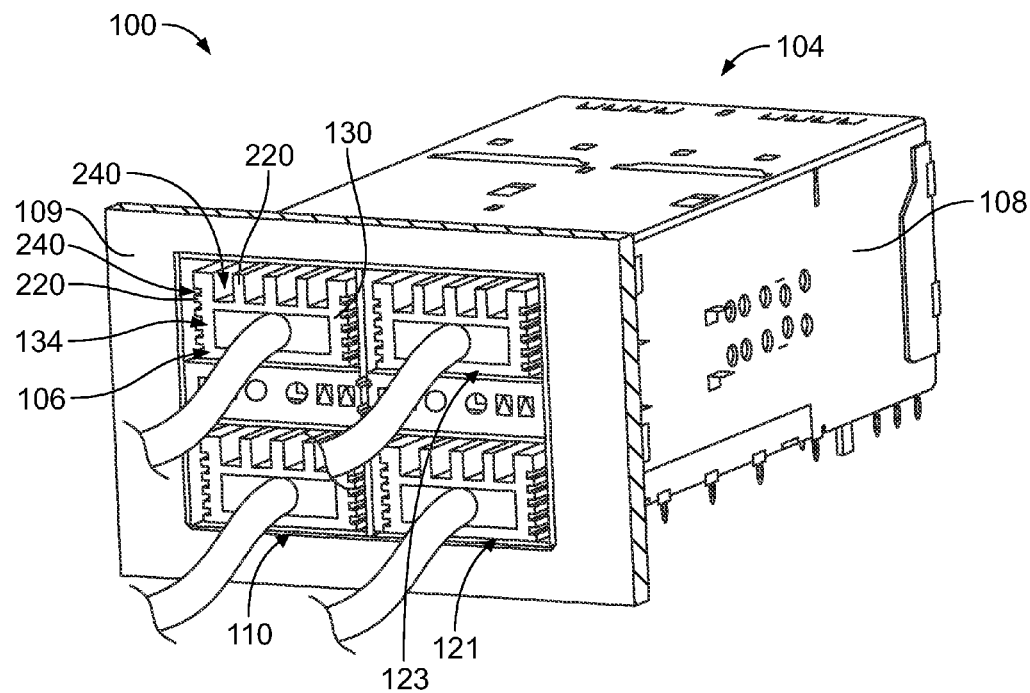
FIG. 5 is a front perspective view of the communication system showing the pluggable modules loaded in the receptacle assembly.

FIG. 5 is a front perspective view of the communication system 100 showing the pluggable modules 106 loaded in the receptacle assembly 104. The receptacle assembly 104 passes through an opening in the faceplate 109 to a position rearward of the faceplate 109 such that the receptacle assembly 104 is interior of or inside the device having the faceplate 109. In an exemplary embodiment, the faceplate 109 is conductive, such as a metal plate or bezel. The receptacle assembly 104 is electrically connected to the faceplate 109, such as using one or more gaskets. The electrical connection at the interface between the faceplate 109 and the receptacle housing 108 reduces EMI at the interface.

In an exemplary embodiment, the fins 220 are provided at the cable ends 134 of the pluggable bodies 130. For example, the fins 220 are provided at the front end 110 of the receptacle housing 108. The fins 220 are oriented such that the channels 240 are open to the external environment forward of the faceplate 109. The fins 220 are positioned along the pluggable body 130 such that the fins 220 are exposed at the port openings 121, 123 of the receptacle assembly 104. The fins 220 may extend from inside the receptacle assembly 104 to outside of the receptacle assembly 104, such as beyond the front end 110. The fins 220 may extend beyond or forward of the faceplate 109 in various embodiments. In alternative embodiments, the fins 220 may be recessed behind or rearward of the front end 110 and/or the faceplate 109, however the channels 240 are open to the exterior environment of the chassis forward of the faceplate 109. Having the fins 220 extend as such, relative to the cable ends 134, the faceplate 109 and the receptacle housing 108, allows the channels 240 to facilitate airflow between the internal environment and the external environment of the chassis. For example, air is able to flow through the channels 240 from inside the receptacle assembly 104, and is exhausted forward of the faceplate 109, which cools the fins 220 and the pluggable body 130. Alternatively, cool air is able to flow from outside of the receptacle assembly 104 through the channels 240 into the receptacle assembly 104 to cool the fins 220 and the pluggable body 130.

Figure 6:
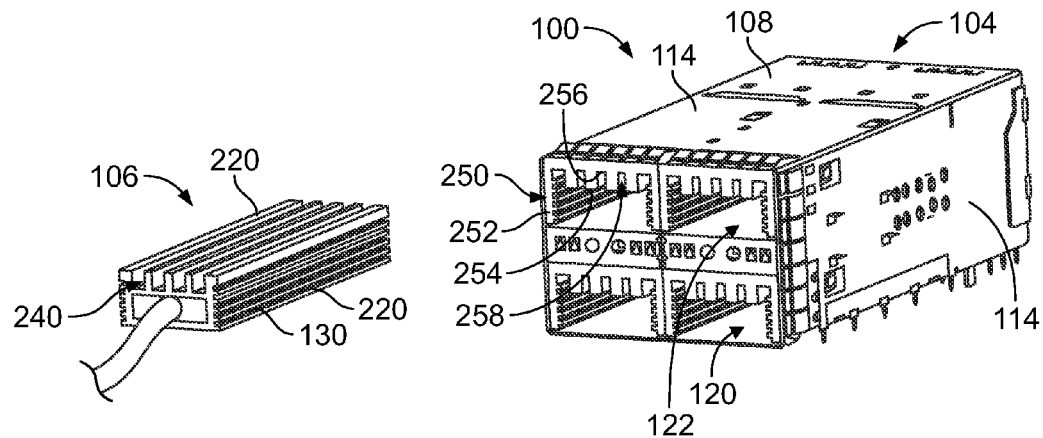
FIG. 6 is a front perspective view of the communication system showing thermal transport inserts in the receptacle assembly in accordance with an exemplary embodiment.
Figure 7:
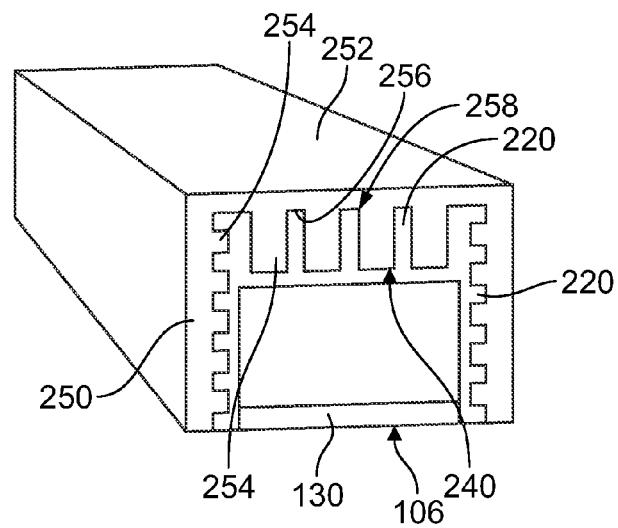
FIG. 7 is a front perspective view of a portion of the communication system showing one of the pluggable modules mated with the corresponding thermal transport insert shown in FIG. 6.

FIG. 6 is a front perspective view of the communication system 100 showing the receptacle assembly 104 with thermal transport inserts 250. The receptacle assembly 104 may optionally include the thermal transport inserts 250 for transferring heat from the pluggable modules 106. FIG. 7 is a front perspective view of a portion of the communication system 100 showing one of the pluggable modules 106 mated with the corresponding thermal transport insert 250. The receptacle housing 108 (shown in FIG. 6) is removed for clarity in FIG. 7 to illustrate the thermal transport insert 250.

The thermal transport insert 250 is configured to be positioned in the corresponding module cavity 120, 122. The thermal transport insert 250 is manufactured from a material having high thermal conductivity to facilitate transferring the heat from the pluggable module 106. Heat may be dissipated by the thermal transport insert 250, such as into the surrounding environment, and/or the thermal transport insert 250 may transfer the heat to another structure, such as another heat sink or an integral heat sink remote from the pluggable module 106. In an exemplary embodiment, the thermal transport insert 250 is configured to be placed in thermal communication with the pluggable body 130 to transfer the heat therefrom. In alternative embodiments, the thermal transport insert 250 may be integral with the receptacle housing 108. For example, the thermal transport insert 250 may be formed from the housing walls 114.

The thermal transport insert 250 includes a body 252. In the illustrated embodiment, the body 252 is C-shaped; however the body 252 may have other shapes in alternative embodiments. The thermal transport insert 250 includes a plurality of rails 254 extending inward from an interior surface 256 of the body 252. Grooves 258 are defined between the rails 254. The rails 254 and grooves 258 may have any shape; however, in an exemplary embodiment, the rails 254 and grooves 258 have a complementary shape to the pluggable body 130. For example, the rails 254 may be sized and shaped to be received in corresponding channels 240 of the pluggable body 130, and the grooves 258 may be sized and shaped to receive the fins 220. The fins 220 engage the rails 254 to transfer heat from the pluggable body 130 into the rails 254 and the thermal transport insert 250.

Optionally, the rails 254 and grooves 258 may have lead-ins to guide loading of the pluggable module 106 into the heat sink insert 250. For example, the rails 254 may be chamfered such that the grooves 258 are wider at the front end of the heat sink insert 250. The heat sink insert 250 receives the pluggable module 106 and guides loading of the pluggable module 106 into the receptacle housing 108. The thermal transport insert 250 may guide mating of the pluggable module 106 with the communication connector 142 (shown in FIG. 2).

When the pluggable module 106 is loaded into the thermal transport insert 250, the pluggable body 130 is in thermal communication with the thermal transport insert 250 to transfer heat thereto. In such embodiments, rather than using convection cooling by airflow through the channels 240, the pluggable body 130 is cooled by transferring heat directly into the thermal transport insert 250.

Figure 8:
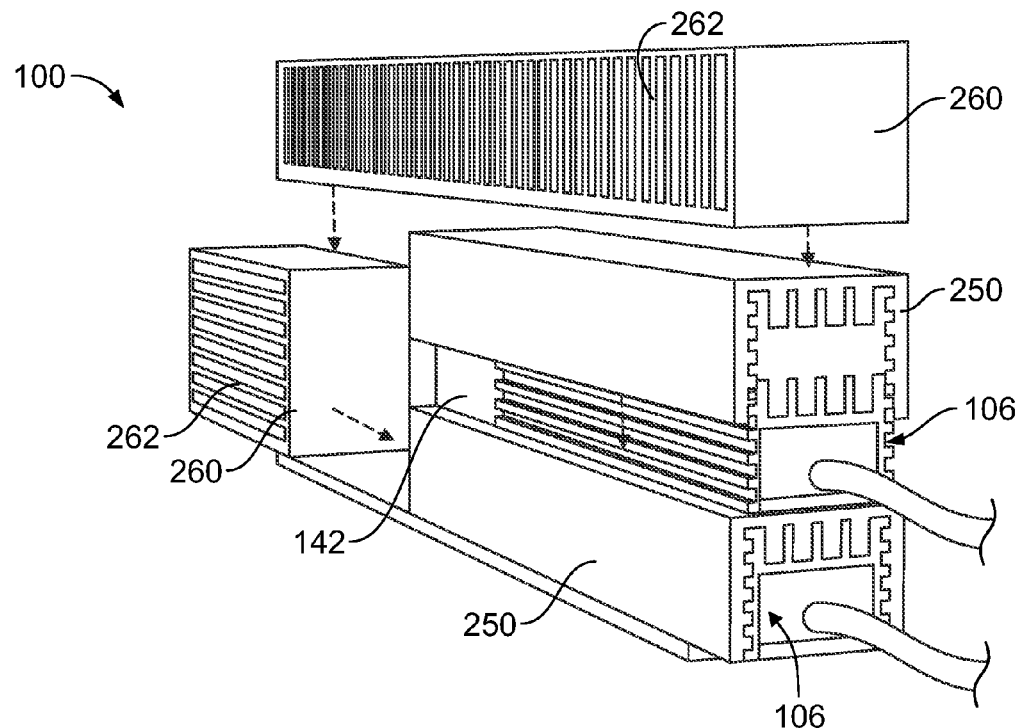
FIG. 8 is a partially exploded view of a portion of the communication system showing pluggable modules and corresponding thermal transport inserts.

FIG. 8 is a partially exploded view of a portion of the communication system 100 showing pluggable modules 106 and corresponding thermal transport inserts 250. The receptacle housing 108 (shown in FIG. 6) is removed for clarity in FIG. 8 to illustrate the thermal transport inserts 250. The upper thermal transport insert 250 is shown removed from the upper pluggable module 106 to illustrate the pluggable module 106 mated with the corresponding communication connector 142. Optionally, the thermal transport inserts 250 may be sized to receive the communication connectors 142 and may extend rearward of the communication connectors 142.

In an exemplary embodiment, the thermal transport inserts 250 may transfer the heat away from the pluggable module 106. The thermal transport inserts 250 may pipe or transfer the heat out of the receptacle housing 108, such as behind the receptacle housing 108, to another heat sink 260, such as a heat sink block located rearward of the receptacle housing 108, above the receptacle housing 108, or elsewhere. Optionally, the heat sink 260 may be integral with the thermal transport insert(s) 250. The heat sink 260 may have fins 262 or other features to efficiently transfer heat from the thermal transport insert 250. Optionally, air may flow through the heat sink 260 across the fins 262. Active cooling, such as via a fan or other cooling device, may be used to cool the thermal transport inserts 250 and/or heat sink 260.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A pluggable module comprising:
a pluggable body extending between a mating end and a cable end, the pluggable body having a first end and an opposite second end with sides extending therebetween along a length of the pluggable body, the first end, the second end and the sides defining a cavity; and
an internal circuit board held in the cavity, the internal circuit board being provided at an end of a cable communicatively coupled to the internal circuit board, wherein the pluggable body is configured to be plugged into a receptacle assembly such that the internal circuit board is communicatively coupled to a communication connector of the receptacle assembly;
wherein the pluggable body includes a plurality of fins extending outward from at least one of the first end, the second end and the sides, the fins run lengthwise between the cable end and the mating end.

2. The pluggable module of claim 1, wherein the fins run approximately the entire length of the pluggable body between the cable end and the mating end.

3. The pluggable module of claim 1, wherein the fins are parallel plates.

4. The pluggable module of claim 1, wherein the fins extend from both sides.

5. The pluggable module of claim 1, wherein the fins are separated by channels configured to receive rails of the receptacle assembly, the fins engaging the rails to transfer heat from the pluggable body into the rails.

6. The pluggable module of claim 1, wherein the fins extend lengthwise from inside the receptacle assembly to outside of the receptacle assembly forward of the receptacle housing.

7. The pluggable module of claim 1, wherein the fins are separated by channels, the channels being open at the cable end to allow airflow along the fins from the cable end toward the mating end.

8. The pluggable module of claim 1, wherein the fins include end fins extending from the first end and side fins extending from both sides.

9. The pluggable module of claim 8, wherein at least some of the side fins extend from the end fins.

10. The pluggable module of claim 1, wherein the fins are positioned along the pluggable body such that the fins are exposed at a port opening of the receptacle assembly.

11. The pluggable module of claim 1, wherein the pluggable body includes a thickness defined between an interior surface defining the cavity and an exterior surface opposite the interior surface, the fins extending outward from the exterior surface such that edges of the fins are spaced outward from the exterior surface.

12. A pluggable module comprising:
a pluggable body extending between a mating end and a cable end, the pluggable body having a first end and an opposite second end with sides extending therebetween along a length of the pluggable body, the first end, the second end and the sides defining a cavity; and
an internal circuit board held in the cavity, the internal circuit board being provided at an end of a cable communicatively coupled to the internal circuit board, wherein the pluggable body is configured to be plugged into a receptacle assembly such that the internal circuit board is communicatively coupled to a communication connector of the receptacle assembly;
wherein the pluggable body includes a plurality of first end fins extending outward from the first end and the pluggable body including a plurality of side fins extending outward from at least one of the sides, the fins run lengthwise between the cable end and the mating end.

13. The pluggable module of claim 12, wherein the fins are separated by channels configured to receive rails of the receptacle assembly, the fins engaging the rails to transfer heat from the pluggable body into the rails.

14. The pluggable module of claim 12, wherein the fins extend from inside the receptacle assembly to outside of the receptacle assembly.

15. The pluggable module of claim 12, wherein the fins are separated by channels, the channels being open at the cable end to allow air flow along the fins from the cable end toward the mating end.

16. A communication system comprising:
a pluggable module comprising a pluggable body extending between a mating end and a cable end, the pluggable body having a first end and an opposite second end with sides extending therebetween along a length of the pluggable body, the first end, the second end and the sides defining a cavity, the pluggable body having a plurality of fins extending outward from at least one of the first end, the second end and the sides, and the pluggable module having an internal circuit board held in the cavity, the internal circuit board being provided at an end of a cable communicatively coupled to the internal circuit board; and
a receptacle assembly having a receptacle housing defining a module cavity with a port opening at a front end of the receptacle housing open to the module cavity, the front end of the receptacle housing being configured to be positioned within an opening of a faceplate, the module cavity receiving the pluggable module through the port opening, the receptacle assembly having a communication connector within the receptacle housing at a rear end of the receptacle housing, the pluggable module being pluggably coupled to the communication connector such that the internal circuit board is communicatively coupled to the communication connector;
wherein the fins are positioned at the front end such that the fins allow airflow between the module cavity behind the faceplate and an exterior environment forward of the faceplate.

17. The communication system of claim 16, wherein the receptacle assembly comprises a thermal transport insert in the module cavity, the pluggable module directly engaging the thermal transport insert, the thermal transport insert drawing heat from the pluggable body to cool the pluggable body.

18. The communication system of claim 17, wherein the thermal transport insert includes grooves formed by rails, the grooves receiving corresponding fins such that the rails are positioned between, and receive heat from, adjacent fins.

19. The communication system of claim 16, wherein the fins extend from inside the receptacle assembly to outside of the receptacle assembly.

* * * * *